United States Patent
Auerswald

(10) Patent No.: US 6,419,980 B1
(45) Date of Patent: Jul. 16, 2002

(54) PROCESS FOR PRODUCING AN AUTOMATIC-MACHINE-BONDABLE CERAMIC CIRCUIT CARRIER, AND AUTOMATIC-MACHINE-BONDABLE CERAMIC CIRCUIT CARRIER

(75) Inventor: Gerd Auerswald, Neuhof A.D. Zenn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/572,103

(22) Filed: May 17, 2000

(30) Foreign Application Priority Data

May 17, 1999 (DE) ......................................... 199 22 553

(51) Int. Cl.⁷ ................................................ B05D 5/12
(52) U.S. Cl. ...................... 427/96; 427/125; 427/126.2; 427/126.5; 427/383.5
(58) Field of Search .......................... 427/96, 120, 125, 427/126.5, 383.5, 126.2

(56) References Cited

U.S. PATENT DOCUMENTS

| 5,216,207 A | * | 6/1993 | Prabhu et al. | 174/256 |
| 5,744,232 A | * | 4/1998 | Bailey et al. | 428/323 |
| 6,217,821 B1 | * | 4/2001 | Donohue | 264/619 |

FOREIGN PATENT DOCUMENTS

EP 0 370 227 A2 5/1990

OTHER PUBLICATIONS

"Metallisieren von Aluminuimnitridsubstraten" (Werdecker), dated Nov. 12, 1987, Technische Rundschau 41/87, pp. 106–113, pertains to the metallizing of aluminum nitrite substrates.

"Glass–Free Molybdenum Conductive Patterns On Ceramic Substrates" (Fury et al.), dated Oct. 1982, IBM Technical Disclosure Bulletin, vol. 25, No. 5, p. 2275, as mentioned on p. 3 of the specification.

Japanese Patent Abstract No. 07157812 A (Yoichiro et al.), dated Jun. 20, 1995, as mentioned on p. 4 of the specification.

"Keramik–Multilayer: Technologie mit Recyclingvorsprung" (Distler), Elektronik Mar. 1994, pp. 30–33, pertains to multi–layered ceramic, a technology with advanced recycling.

* cited by examiner

Primary Examiner—Brian K. Talbot
(74) Attorney, Agent, or Firm—Laurence A. Greenberg; Werner H. Stemer; Ralph E. Locher

(57) ABSTRACT

A process for producing an automatic-machine-bondable LTCC (Low Temperature Cofired Ceramics) circuit carrier includes the steps of applying a conductive paste having a glass content of less than 1.0 percent by weight onto a ceramic substrate having a glass content of at least 30 percent by weight, in order to form contact pads. The circuit carrier is fired such that glass melts out of the ceramic substrate and causes an adhesion between the conductive paste and the ceramic substrate. A ceramic circuit carrier has adhesion-promoting glass between the ceramic substrate and the conductive paste, wherein the adhesion-promoting glass originates from the ceramic substrate.

4 Claims, 1 Drawing Sheet

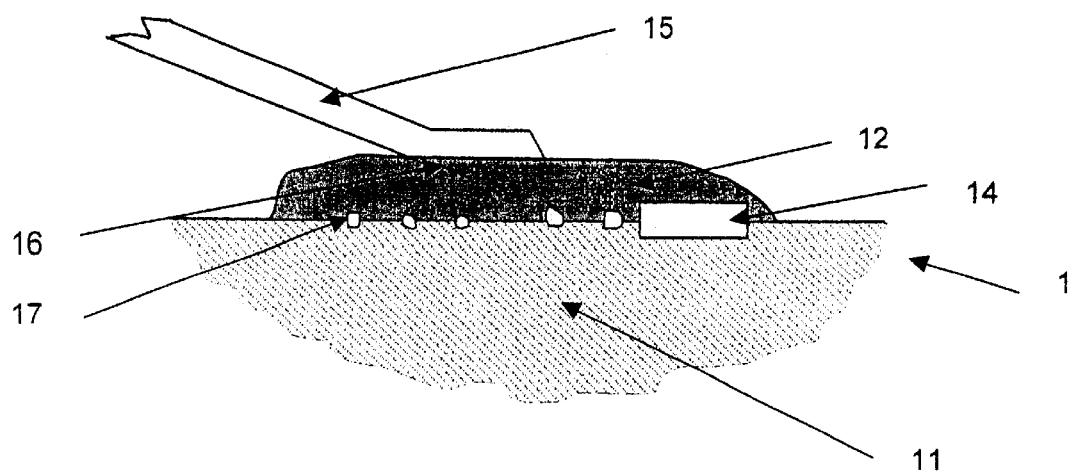

PROCESS FOR PRODUCING AN AUTOMATIC-MACHINE-BONDABLE CERAMIC CIRCUIT CARRIER, AND AUTOMATIC-MACHINE-BONDABLE CERAMIC CIRCUIT CARRIER

BACKGROUND OF THE INVENTION

Field of the Invention

The invention relates to an automatic-machine-bondable ceramic circuit carrier, and to a process of producing such a ceramic circuit carrier.

Conventional ceramic circuit carriers, which are used as thick-film modules, have a ceramic substrate with a ceramic content of 96% by weight and a glass content of 4% by weight. To produce contact pads on the surface of the ceramic substrate, a conductive paste or gold paste with a glass content of between 1% and 10% is applied. This glass content is necessary for achieving an adhesion between the ceramic substrate and the gold paste and for forming a sintered structure of the gold paste. When the ceramic circuit carrier is fired, the glass contained in the gold paste flows out or drains off to a sufficient extent, so that the surface of the gold contact pad is sufficiently free of glass constituents. On such a surface, a gold wire can be used for bonding without problems.

Because of a wide range of advantageous properties, circuit carriers which are based on LTCC (Low Temperature Cofired Ceramics) are being increasingly used. Such a ceramic circuit carrier is known, for example, from the article "Keramik-Multilayer: Technologie mit Recyclingvorsprung" (Ceramic Multilayer: Technology having a Lead in Recycling) in the journal Elektronik, 3/1994, pages 30 to 33. The LTCC substrate is generally formed of from 40% to 70% ceramic fraction ($Al_2O_3$) and 60% to 30% glass fraction ($SiO_2$). During the firing process, the high glass content serves as a sintering catalyst and allows using a relatively low firing temperature.

The high glass content in the LTCC ceramic substrate, hinders the glass from flowing or draining off from the surface of the gold paste during firing. This results in a segregation or precipitation of glass residues on the surface of the gold paste and agglomerates inside the gold paste. Both effects prevent the uniform formation of a so-called wedge, i.e. a homogenous contact surface between the gold wire and the gold paste (contact pad), on the gold thick-film surface. This causes considerable fluctuations in the adhesive strength of the bond connection on the gold thick-film surface. In addition, the glass constituents at the gold surface result in an increase in the contamination of the capillary, i.e. the gripper tool of an automatic bonding machine. As a result, the service life of an automatic bonding machine is reduced considerably.

To ensure a sufficient process reliability during the bonding of LTCC circuit carriers, a second bond is routinely formed at the location of the wedge, in order to stabilize the first bond. As a result, the costs and the time required for producing each circuit carrier rise considerably.

Furthermore, the capillary has to apply comparatively large forces during production of the bond in order to ensure that the bond connection is secure. This presents an obstacle to further increasing the integration level on a circuit carrier with a high glass content, since it is not possible to use finer capillaries with a smaller diameter. In addition, wear is promoted.

Conductive, glass-free molybdenum structures on a ceramic substrate are described in the IBM Technical Disclosure Bulletin, 1982, Vol. 25, No. 5, page 2275. The ceramic substrate is formed of aluminum containing about 10–20 percent by volume of glass powder. To prevent the glass from penetrating into the molybdenum, palladium is admixed with the molybdenum paste. The molybdenum structures of this HTCC (High Temperature Cofired Ceramic) substrate cannot be bonded. Publication No. JP 07157812 A in Patent Abstracts of Japan relates to a metallized composition which has an improved adhesion with respect to a ceramic substrate (alumina substrate). To this end, pulverized glass and copper oxide are added to a metal paste which is substantially composed of copper powder. An alumina substrate for which the metallized composition is to be used generally has a ceramic content of approximately 96% and a glass content of only 4%. A bonding with gold wires on the conductive structures, which are formed by the metallized composition, is not possible.

SUMMARY OF THE INVENTION

It is accordingly an object of the invention to provide a process for producing an automatic-machine-bondable ceramic circuit carrier which overcomes the above-mentioned disadvantages of the heretofore-known processes of this general type and which uses a ceramic substrate with a high glass content. It is also an object of the invention to provide a corresponding ceramic circuit carrier, which has a reduced glass concentration on the surface of contact pads, which are thus well suited for a fully automated bonding.

With the foregoing and other objects in view there is provided, in accordance with the invention, a process for producing an automatic-machine-bondable LTCC circuit carrier, which includes the steps of:

providing a ceramic substrate having a glass content of at least 30 percent by weight;

applying a conductive paste having a glass content of less than 1.0 percent by weight on the ceramic substrate for forming contact pads; and melting glass out of the ceramic substrate and causing an adhesion between the conductive paste and the ceramic substrate by firing the ceramic substrate and the conductive paste for forming an automatic-machine-bondable LTCC circuit carrier.

According to the invention, the glass content in the conductive paste is reduced considerably. The glass content in the ceramic substrate plays the decisive role in producing the adhesion between the conductive paste and the ceramic substrate. A homogeneous distribution of glass agglomerates in the conductive paste is avoided.

The glass content in the ceramic substrate is at least 30 percent by weight. Preferably, the glass content in the ceramic substrate is at most 60 percent by weight.

A suitable conductive paste is in particular a paste made from a precious metal, such as gold, silver, palladium, platinum and their alloys. The precious metal content should be at least 98.9 percent by weight, and preferably at least 99.0 percent by weight. The glass content should be less than one percent by weight, preferably less than 0.3 percent by weight, and particularly preferably at most 0.1 percent by weight.

According to a preferred feature of the invention, the conductive paste is entirely free of crystalline glass. Any glass fractions contained in the conductive paste are then amorphous glass.

The sintering behavior of the conductive paste can be adapted to the flow properties of the glass in the ceramic substrate by the addition of sinter-active additives, so that despite the reduction in the glass content in the conductive paste a sufficient number of adhesion centers are formed between the ceramic substrate and the conductive paste.

The optional addition of sinter-active additives to the conductive paste ensures a particularly homogeneous sintering of the conductive paste. Suitable additives are metals or metal oxides, such as for example rhodium (Rh), cadmium (Cd), antimony (Sb), iron (Fe) and bismuth oxide ($Bi_2O_3$). The content of one or more sinter-active additives may amount to approximately 0.2 to 2.5 percent by weight, and is preferably between 0.3 and 1.1 percent by weight.

With the objects of the invention in view there is also provided, an automatic-machine-bondable ceramic circuit carrier, including:

a ceramic substrate having a glass content of at least 30 percent by weight;

a contact pad disposed on the ceramic substrate, the contact pad being formed of a conductive paste having a glass content of less than 1.0 percent by weight prior to the ceramic substrate and the conductive paste being fired; and an adhesion-promoting glass disposed between the ceramic substrate and the conductive paste.

Due to the pure surface of the conductive paste, which is not disrupted by inhomogeneous inclusions of glass and oxide agglomerates, the ceramic circuit carrier according to the invention allows a uniform formation of wedges. The bonding operation on such a circuit carrier has a high level of process reliability, so that fully automatic bonding machines can be used without problems. There is no need for the contact pads which are to be bonded to be visually checked for glass agglomerates by an operator. Nor is there any need for a second bond (security bond) for the production of an electrical connection. In a preferred embodiment of the invention there is accordingly only one bond connection per contact pad.

Due to the lack of glass agglomerates on that surface of the contact pads which is remote from the ceramic substrate, the contamination to the capillary of an automatic bonding machine is reduced considerably, and its service life is increased substantially.

Due to the homogeneous surface of a contact pad, the bonding forces which have to be applied by the capillary of an automatic bonding machine are low, and consequently the diameter of a capillary can be reduced. Due to the finer structure, the integration level on the ceramic circuit carrier can be increased. The diameter of a bonding wire can be reduced. Instead of a range from 30 μm to 60 μm, a range from 15 μm to 60 μm is now suitable for the diameter of the bonding wire.

Moreover, the low level of contamination of the capillary and the relatively low bonding forces which have to be applied increase the service life of the capillaries such that the service life is multiplied. It is therefore possible to perform a virtually uninterrupted bonding process.

Other features which are considered as characteristic for the invention are set forth in the appended claims.

Although the invention is illustrated and described herein as embodied in a process for producing an automatic-machine-bondable ceramic circuit carrier, and in a corresponding automatic-machine-bondable ceramic circuit carrier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE is a diagrammatic sectional view of a multilayer ceramic circuit carrier after a firing process.

DESCRIPTION OF THE PREFERRED EMBODIMENTS

Referring now to the FIGURE of the drawings in detail and first, particularly, to FIG. 1 thereof, there is shown an LTCC circuit carrier 1 which has a ceramic substrate 11 with a glass content ($SiO_2$) of approximately 40 percent by weight and a ceramic content ($Al_2O_3$) of about 60 percent by weight. The ceramic circuit carrier 1 is a thick-film module.

A conductive paste 12 includes 99.0 percent by weight gold (Au) and 1 percent by weight rhodium (Rh) and forms a contact pad for a bond connection to the circuit carrier. The conductive paste contains no glass.

Glass 17 in the form of agglomerates has migrated from the ceramic substrate 11 with a high glass content into the conductive paste 12, so that a glass agglomerate is partially enclosed in the conductive paste 12 and, at the same time, is partially enclosed in the ceramic substrate 11. The glass 17 produces a mechanical adhesion between the ceramic substrate and the conductive paste.

The contact pad sintered from the conductive paste 12 is in direct electrical and mechanical contact with a conductor track 14 of the circuit carrier 1. The conductor track 14 connects the contact pad to an electronic circuit of the circuit carrier.

A bond connection was formed between a bonding wire 15 made from gold and the contact pad using an automatic bonding machine. In the region of a wedge 16, there is an electrical contact between that surface of the contact pad which is remote from the ceramic substrate 11 and the bonding wire 15.

During the production of the ceramic circuit carrier 1, the conductive paste 12 is screen-printed onto the ceramic substrate 11 and is then fired or baked at 900° C. in air.

The sintering behavior of the conductive paste 12 is adapted to the flow behavior of the glass in the ceramic substrate 11 by the addition of the sinter-active rhodium. This ensures that the glass 17 in the ceramic substrate 11 melts and, because of capillary forces and the wetting properties, penetrates partially into the conductive paste in the form of agglomerates. The glass 17 from the ceramic substrate assumes the function of an adhesion promoter and thus makes it unnecessary to add inorganic adhesion promoters (glass) to the conductive paste.

The circuit carrier 1 can be bonded using an automatic bonding machine without the need for a visual inspection of a contact pad to check for glass constituents on the surface which is to be bonded.

Due to the homogenous surface of the contact pad on the side which is remote from the ceramic substrate 11, with a uniform formation of the wedge 16, firstly there is only very little contamination to a capillary of an automatic bonding machine, and secondly the capillary only has to exert a relatively slight bonding force on the contact pad. For this reason, the bonding process only has to be interrupted very infrequently for maintenance of the capillary.

I claim:

1. A process for producing an automatic-machine-bondable LTCC circuit carrier, which comprises:

providing a ceramic substrate having a glass content of at least 30 percent by weight;

applying a conductive paste having a glass content of less than 1.0 percent by weight on the ceramic substrate for forming contact pads; and melting glass out of the ceramic substrate and causing an adhesion between the conductive paste and the ceramic substrate by firing the ceramic substrate and the conductive paste for forming an automatic-machine-bondable LTCC circuit carrier.

2. The process according to claim 1, which comprises providing the conductive paste as a paste with 0.2 to 2.5 percent by weight of a material selected from the group consisting of sinter-active metal and metal oxide.

3. The process according to claim 1, which comprises providing the conductive paste as a paste containing at least 98.9 percent by weight of a precious metal.

4. The process according to claim 3, which comprises providing the conductive paste as a paste containing 0.3 to 1.1 percent by weight of a material selected from the group consisting of sinter-active metal and metal oxide.

* * * * *